United States Patent
Hoose et al.

(10) Patent No.: US 6,693,925 B2
(45) Date of Patent: Feb. 17, 2004

(54) MODULATABLE MULTI-WAVELENGTH FIBER LASER SOURCE

(75) Inventors: John Hoose, Fairport, NY (US); Robert Frankel, Rochester, NY (US)

(73) Assignee: Chromaplex, Inc, West Henrietta, NY (US)

(*) Notice: Subject to any disclaimer, the term of this patent is extended or adjusted under 35 U.S.C. 154(b) by 0 days.

(21) Appl. No.: 10/118,640

(22) Filed: Apr. 8, 2002

(65) Prior Publication Data

US 2002/0154661 A1 Oct. 24, 2002

Related U.S. Application Data

(60) Provisional application No. 60/285,008, filed on Apr. 18, 2001.

(51) Int. Cl.$^7$ ............................................. H01S 3/30
(52) U.S. Cl. ............................. 372/6; 372/10; 372/94
(58) Field of Search ............................ 372/6, 92, 94, 372/108, 10; 385/11, 15, 14; 359/256

(56) References Cited

U.S. PATENT DOCUMENTS

| | | | |
|---|---|---|---|
| 4,786,131 A | | 11/1988 | Mahapatra et al. |
| 5,163,058 A | * | 11/1992 | Farries et al. ................. 372/6 |
| 5,295,209 A | | 3/1994 | Huber |
| 5,303,314 A | * | 4/1994 | Duling et al. ................. 385/11 |
| 5,524,118 A | | 6/1996 | Kim et al. |
| 5,812,712 A | | 9/1998 | Pan |
| 5,878,071 A | * | 3/1999 | Delavaux ..................... 372/94 |
| 6,192,062 B1 | * | 2/2001 | Sanchez-Rubio et al. ..... 372/92 |
| 6,208,679 B1 | * | 3/2001 | Sanchez-Rubio et al. ..... 372/92 |
| 6,275,623 B1 | * | 8/2001 | Brophy et al. ................ 385/14 |
| 6,282,016 B1 | | 8/2001 | MacCormack et al. |
| 6,295,304 B1 | | 9/2001 | Koch et al. |
| 6,327,292 B1 | * | 12/2001 | Sanchez-Rubio et al. ..... 372/92 |
| 6,374,006 B1 | * | 4/2002 | Islam et al. ................... 385/15 |
| 6,404,956 B1 | | 6/2002 | Brennan, III et al. |
| 6,529,307 B1 | * | 3/2003 | Peng et al. ................... 359/256 |
| 6,529,542 B1 | * | 3/2003 | Karlsen et al. ............... 372/108 |

OTHER PUBLICATIONS

Veselka, J. J. & Korotky, S. K. A Multiwavelength Source Having Precise Channel Spacing for WDM Systems. *IEEE Photonics Technology Letters* 10, 958–960 (Jul. 1998).

Kim, S. K. et al. Wideband multiwavelength erbium–doped fiber ring laser. *Optical Communications Department, Switching and Transmission Technology Laboratory–Electronics and Telecommunications Research Institute.* 8–10.

Li, Y. P. & Henry, C. H. "Silicon Optical Bench Waveguide Technology" *Optical Fiber Communications IIIB*. I. P. Kaminov & T. L. Koch eds., Academic Press, 351–358 (1997).

Niemi, T. et al. Tunable Silicon Etalon for Simultaneous Spectral Filtering and Wavelength Monitoring of a DWDM Transmitter. *IEEE Photonics Technology Letters* 13, 58–60 (Jan. 2001).

* cited by examiner

*Primary Examiner*—Paul Ip
*Assistant Examiner*—Tuan Nguyen
(74) *Attorney, Agent, or Firm*—Ropes & Gray LLP

(57) ABSTRACT

A multi-wavelength external cavity fiber laser system is disclosed. Laser radiation from the cavity can be externally modulated at each wavelength and outputted as an overlapping beam having substantially all the wavelengths produced by the laser elements through a single fiber or as an array of wavelength-separated beams. The fiber laser can include an intra-cavity etalon that allows all wavelength to be tuned simultaneously.

22 Claims, 4 Drawing Sheets

MODULATABLE MULTI-WAVELENGTH FIBER LASER SOURCE

CROSS-REFERENCE TO OTHER PATENT APPLICATIONS

This application claims the benefit of U.S. provisional Application No. 60/285,008, filed Apr. 18, 2001, the entire content of which is incorporated herein by reference.

FIELD OF THE INVENTION

The invention relates to a multi-wavelength laser, and more particularly, to a modulatable external cavity fiber laser providing stable multi-wavelength laser emission with a predetermined wavelength spacing for wavelength division multiplexing applications.

BACKGROUND OF THE INVENTION

Optical networks are becoming increasingly complex and use multiple wavelengths transmitted simultaneously over the same fiber. This transmission method is referred to as dense wavelength division multiplexing (DWDM), with the number of active channels continuing to increase. The international telecommunications union (ITU) standards body has proposed a channel allocation grid with 100 GHz channel spacing (~0.81 nm at a 1550 nm wavelength) on even 100 GHz intervals, counting nominally in both directions from a center frequency of 193.1 THz. Newer systems are being designed to reduce the channel spacing to 50 GHz or less. In addition, the total wavelength range over which these devices are designed to operate is increasing. Cost control is very important for system deployment. It would be very desirable to have one laser source module serve as the source for all the channels in the optical system. In addition, it is desirable to have the module be both scaleable and upgradeable in a granular manner. Scaleable means that the system may be upgraded from small channel counts to larger channel counts. Granularity implies that the upgrades can be implemented one channel, or a few channels, at a time.

Optical communication systems are required to have a service life in excess of twenty years. Lasers should be easily reconfigurable and/or replaceable if one of the laser channels malfunctions. In addition, as channel count increases from the present channel count of less than 40 to greater than 100, it would be more cost-effective not to stock 100 different spares, but preferably at most a few "generic" lasers that can be used for several wavelengths.

With a channel spacing of 25 GHz or less, wavelength stability of laser channel sources must be better than a few percent of the channel spacing. The component and system cost of new generations of networks that require greater stability and closer channel spacing should also not increase. Furthermore, crosstalk between channels should be less than 30 dB of the peak channel power which is typically in the range of 1–10 mW.

It would be advantageous to have a single laser module serve as the source for all channels in an optical system. This is a difficult requirement because of mode pulling and homogenous broadening of lasing transitions in gain media. Multi-mode lasing has been demonstrated in erbium-doped fiber ring lasers using an intra-ring etalon. The etalon can be designed with a free spectral range equal to the ITU grid spacing. However, mode pulling is still observed. Insertion of an acousto-optic frequency modulator in the fiber ring can reduce gain pulling. Multi-line performance can be further improved by placing a gain-flattening filter in the cavity to equalize the gain across the desired spectral range. However, most gain flattening filters are unable to sufficiently flatten the gain curve for obtaining a uniform laser emission intensity across the desired spectral range.

In addition to achieving multi-wavelength emission of uniform intensity, the individual emission lines (channels) propagating in the optical fiber still must be separated (demultiplexed) in order to imprint information on the various channels.

It would therefore be desirable to provide a single laser source module that serves as a source for all channels in the optical system. More particularly, it would be desirable to provide a multi-wavelength, gain equalized, demultiplexed laser source system based upon a single gain medium, wherein the channels can be modulated independently. It would also be desirable to multiplex the modulated channels into a single output fiber without the need for multi-fiber interconnections, which can simplify the system design and reduce costs. It would also be desirable to prevent channel drift by locking all channels to a single stable wavelength reference.

SUMMARY OF THE INVENTION

The invention relates to a modulatable external cavity fiber laser providing stable multi-wavelength laser emission. A grating multiplexer section of the laser defines a separate ring topology for each wavelength or channel. Individual mirrors can be placed at the focus of the grating imaging optics operating as parallel output couplers, with the reflectivity of mirrors being tailored to the fiber laser's gain coefficients. The grating can be angle-tuned to different parts of the ITU grid.

According to an aspect of the invention, the multi-wavelength external cavity fiber laser includes a fiber-optic amplifier (FOA) optically coupled to an optical circulator (OC), wherein the FOA receives optical radiation having a plurality of wavelengths from a first port of the OC and supplies amplified optical radiation to a second port of the OC. An optical element, such as a focusing lens, is positioned with its focal plane at a third port of the OC to intercept optical radiation emerging from the third port. The fiber laser further includes a partially reflecting output coupler and a dispersive element positioned in an optical path between the optical element and the output coupler. The partially reflecting output coupler intercepts the plurality of output beams produced by the dispersive element, with each output beam having a unique wavelength. The partially reflecting output coupler and the FOA coupled to the OC form the external cavity of the fiber laser. The dispersive element can be a free space grating or an immersion grating made, for example, of silicon or another material with a suitable index of refraction ($n \geq 1.4$) that is optically transparent in the wavelength range of interest for the application.

The reflectivity of the partially reflecting output coupler for each of the output beams is selected so as to flatten the optical gain of the FOA across the range of emission wavelengths.

The fiber laser further can include optical modulators, wherein each modulator is associated with one of the optical output beams and can modulate the intensity of the particular output beam.

Further embodiments may include one or more of the following features. An acousto-optic frequency shifter (AOFS) as well as a spectral filter, for example, a Fabry-Perot etalon, may be located in the ring topology. Also provided may be a wavelength locker which derives an input signal from at least one wavelength and controls the spectral filter, such as an etalon constructed to have a free spectral range equivalent to the ITU grid spacing, so as to collectively tune and lock each wavelength of the plurality of wavelengths based on the input signal from the at least one wavelength.

A beam combiner located outside the laser cavity can intercept the output modulated beams from the modulator and combine the modulated beams into an overlapping multi-wavelength beam. The beam combiner may include a second focusing element, such as a lens, and a second dispersive element, which can also be a free space grating or an immersion grating. Alternatively, the beam combiner may be a fiber coupler, a star coupler or an arrayed waveguide coupler.

Further features and advantages of the present invention will be apparent from the following description of preferred embodiments.

BRIEF DESCRIPTION OF THE DRAWINGS

The following figures depict certain illustrative embodiments of the invention. These depicted embodiments are to be understood as illustrative of the invention and not as limiting in any way.

DETAILED DESCRIPTION OF CERTAIN ILLUSTRATED EMBODIMENTS

The invention is directed to a fiber laser device that lases simultaneously at several wavelengths, and more particularly to a multi-wavelength fiber laser device with an external grating and external modulators that separately modulate the intensity of the optical radiation at each of the wavelengths produced by the multi-wavelength fiber laser.

Figure 1:
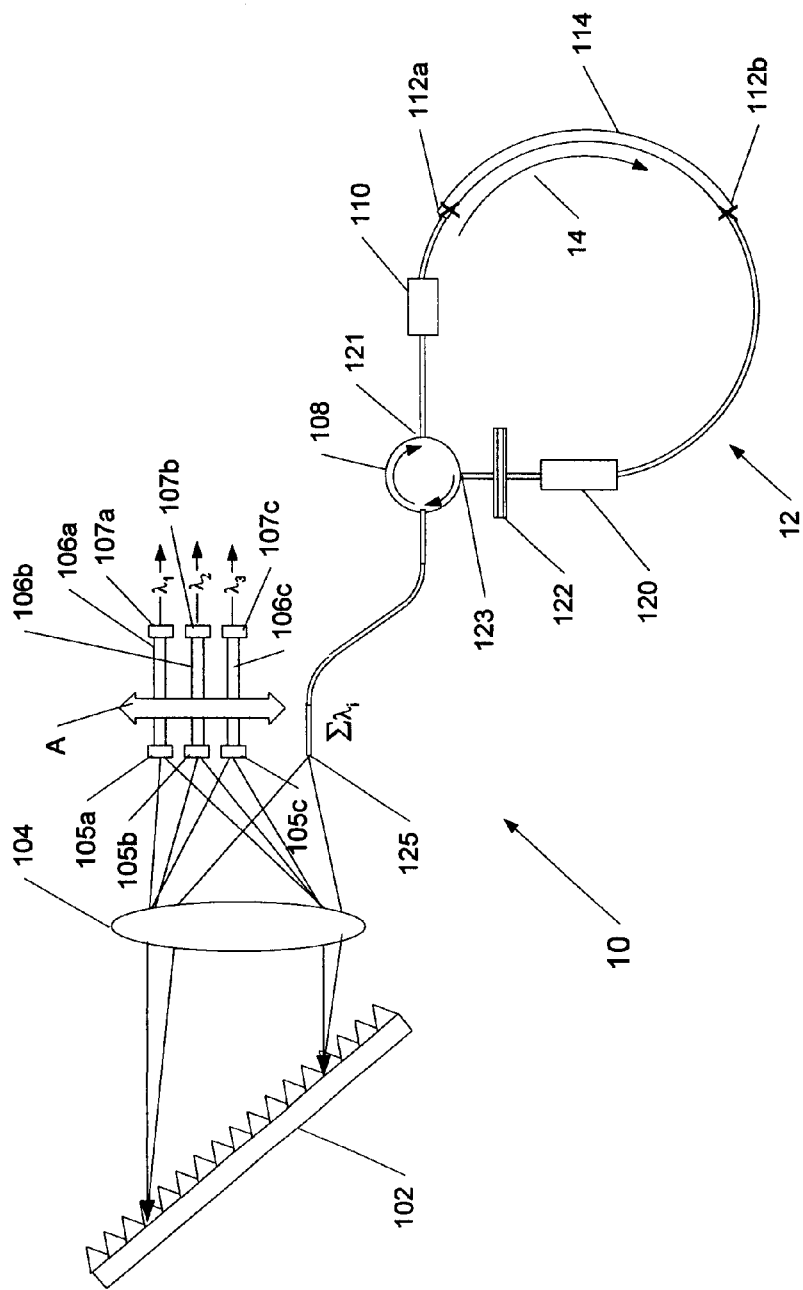
FIG. 1 depicts a multi-channel erbium-doped fiber laser source.

Referring first to FIG. 1, an exemplary multi-channel fiber laser 10 with a plurality of separately modulatable output wavelengths $\lambda_1, \lambda_2, \lambda_3$ includes a unidirectional ring section 12, through which light propagates in the direction indicated by arrow 14. The ring section 14 includes an optical fiber 114 that provides optical gain, an acousto-optic frequency shifter 110, an optical isolator 120 and an optical circulator 108. Optical circulators are non-reciprocal devices that redirect light from port to port sequentially in only one direction. In the exemplary embodiment of FIG. 1, light entering the optical circulator 108 through circulator port 125 travels through circulator 108 and exits the circulator through exit port 121. The light then propagates through acousto-optic frequency shifter (AOFS) 110 to a suitable amplifying fiber 114, such as an erbium-doped fiber. The amplifying fiber is typically optically pumped by diode lasers (not shown) with an emission wavelength that matches an absorption line of the fiber, which for an erbium-doped fiber is preferably approximately 980 nm or 1480 nm. The diode pump lasers are typically coupled to the fiber 114 at the respective end sections 112a, 112b, as is known in the art. The pump wavelength is not critical since the spectral width of the erbium fluorescence curve in the glass matrix is greater than 30 nm. Also provided is an optical isolator 120 to prevent back-reflection and an optional spectral filter 122, such as a Fabry-Perot etalon.

The external cavity of the fiber laser device is bounded by semi-transparent end mirrors 105a, 105b, 105c, with each end mirror 105a, 105b, 105c associated with one of the wavelengths $\lambda_1, \lambda_2, \lambda_3$. Amplified laser light enters the circulator 108 through entrance port 123 and then again exits the circulator 108 through port 125 which is located in the focal plane of a focusing lens 104. The focusing lens 104 intercepts the amplified laser light having all the wavelengths $\Sigma\lambda_i$ propagating in the ring section 12 and projects a collimated beam onto a grating 102, which converts the collimated beam into a plurality of separate diffracted beams with wavelengths $\lambda_1, \lambda_2, \lambda_3$. The diffracted beams are once more intercepted by lens 104 and focused on the various mirrors 105a, 105b, 105c depending on their wavelength $\lambda_i$. The mirrors 105a, 105b, 105c can be in form of separate mirrors, a single mirror, or can be segmented in any other way that provides an essentially flat gain for the useful laser modes propagating in the external cavity.

In the exemplary embodiment depicted in FIG. 1, the gain medium can be an erbium-doped fiber having a length of, for example, 20–50 meters. Since the gain is not uniform across the lasing band, the gain and loss terms should be balanced for each lasing wavelength $\lambda_i$. The laser equation must be satisfied such that $$T(\lambda_i)=G(\lambda_i)-L(\lambda_i)>0 \text{ for all } \lambda_i.$$

$T(\lambda_i)$ is the threshold cavity gain at the wavelength $\lambda_i$, $G(\lambda_i)$ is gain of the lasing medium and $L(\lambda_i)$ is the round trip loss of the cavity. Not only does each lasing wavelength of the cavity have to satisfy the above equation, but the gain should also be substantially uniform across the lasing band, for example, the ITU grid.

A fiber gain medium displays both homogenous and inhomogeneous line broadening. The lasing emission in an inhomogeneously broadened lasing medium does not communicate across the gain band, facilitating multi-line lasing. It should be noted that the present invention is not limited to an erbium-doped fiber laser and that other gain media, such as semiconductor or rare-earth-doped waveguides can be used instead of an optical fiber. The rare-earth dopants in the fiber or waveguide gain section can be selected depending on the desired wavelength range.

Two components define the channel wavelengths—the intra-ring etalon 122 and the wavelength-dispersive free-space grating 102. The intra-cavity etalon 122 is constructed to have a free spectral range equivalent to the ITU grid spacing of, for example, 200, 100, 50, 25 or 12.5 GHz for which the system is designed. The etalon can have finesse from 10 to more than 100. The etalon may be a fiber etalon, a solid etalon or an air gap etalon. Wavelength tuning may be accomplished by adjusting the spacing of the etalon thermally or with an active device, such as a piezo-electric transducer. The multi-line source can advantageously tune all the wavelengths at once simply by adjusting the etalon cavity length. Alternatively, a planar waveguide interferometer may be used to define the emission lines.

The circulator 108 and isolator 120 provide for light propagation around the ring section of the laser in only one direction, which can eliminate spectral hole burning. A circulator is a three terminal optical device, which directs light in either one of two directions depending on the direction of propagation through the device. Fiber circulators are available, for example, from JDS Uniphase, San Jose, Calif. They can operate with unpolarized light or polarized light, with the latter preferred in the illustrated embodiment. The isolator prevents light that is retro-reflected by the etalon from counter-propagating through the gain medium around the ring.

Figure 2:
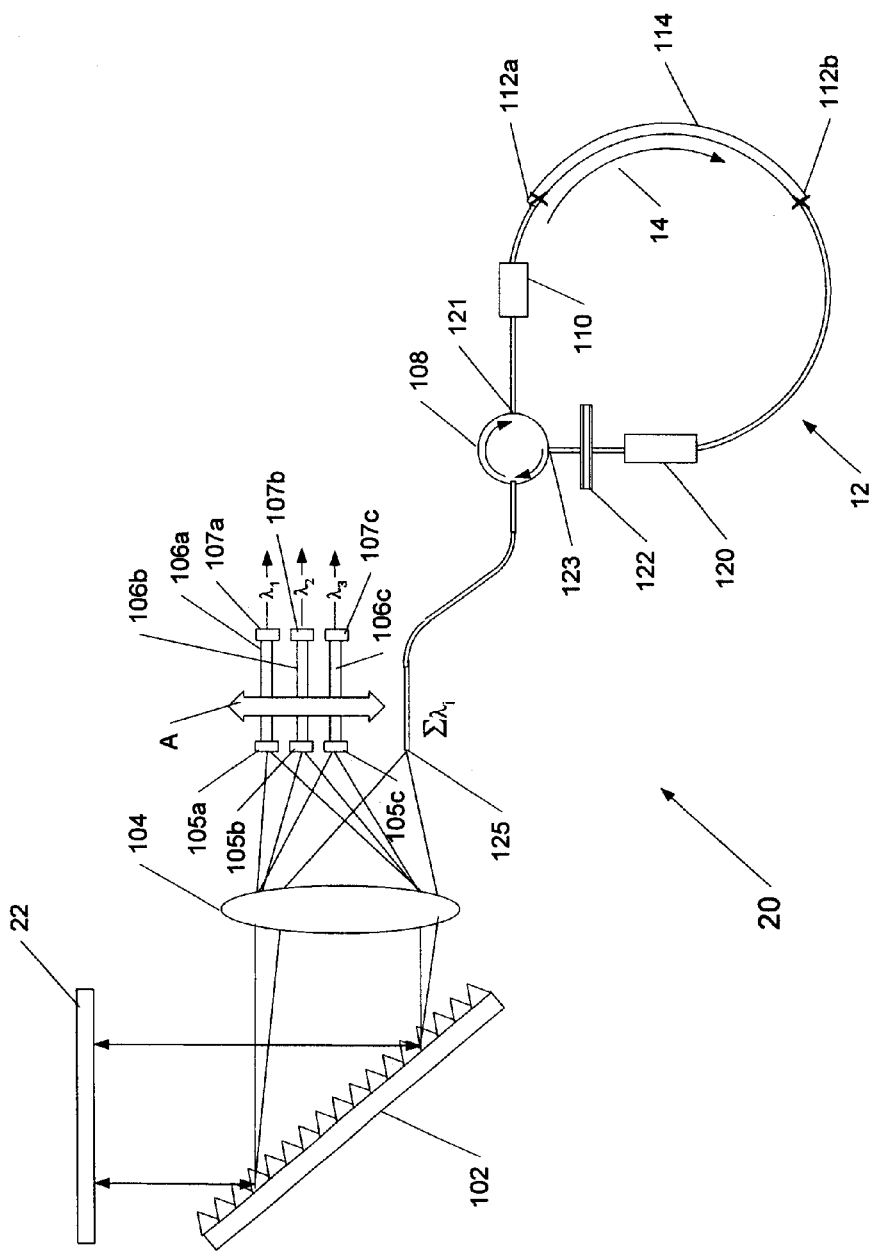
FIG. 2 depicts the laser source of FIG. 1 with a double pass grating configuration.

Referring now to FIG. 2, the laser system 20 is identical to the system 10 of FIG. 1, except for the addition of a mirror 22 which defines a double-pass grating geometry, sometimes also referred to as Littman-Metcalf configuration. The double-pass geometry enhances the wavelength selectivity of the cavity. The wavelengths $\lambda_1$, $\lambda_2$, $\lambda_3$ may also be selected and/or adjusted either by rotating the grating about a pivot point P (see FIG. 3) or by displacing the mirrors 105a, 105b, 105c in a direction indicated by arrow A.

Figure 3:
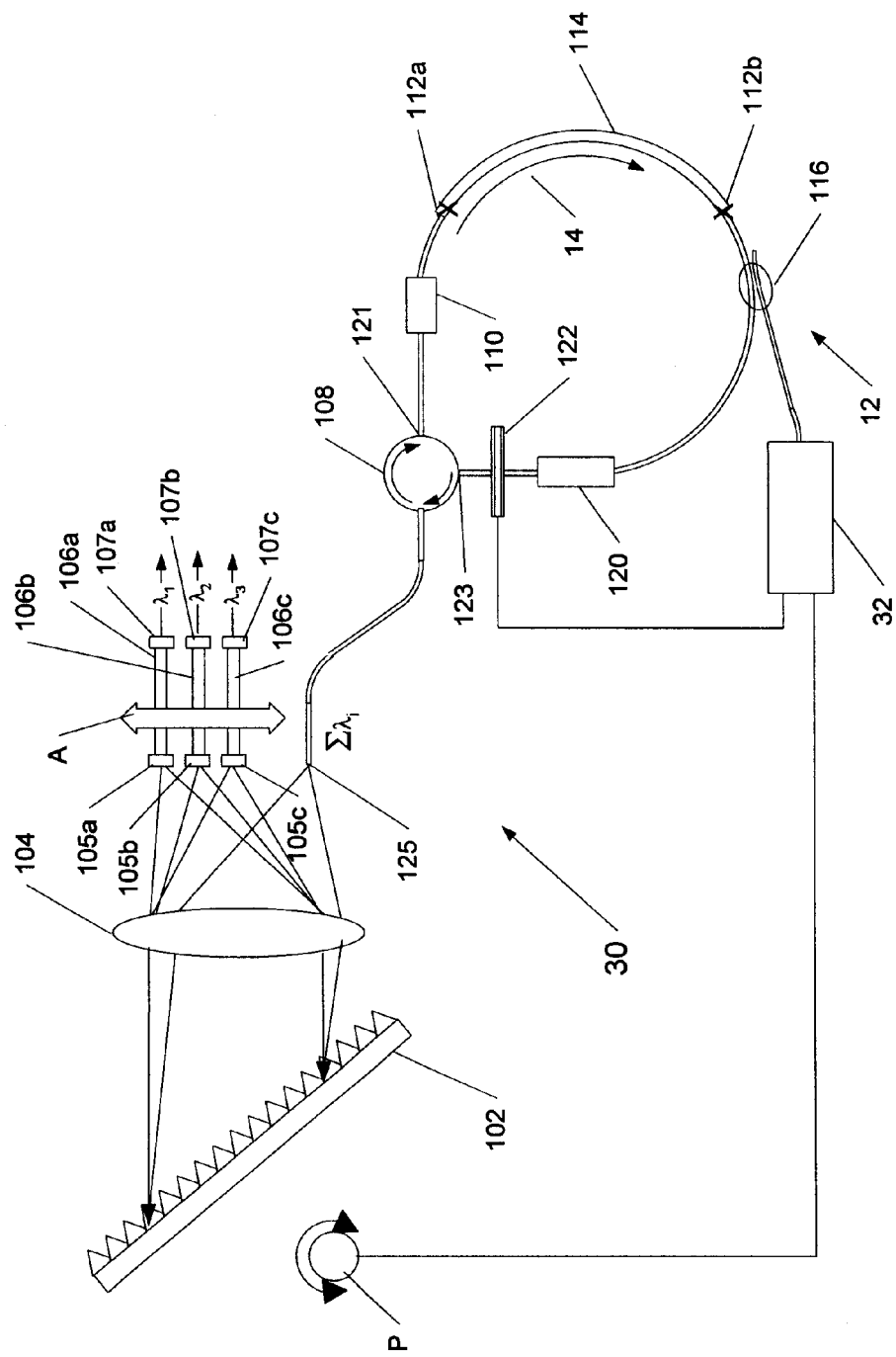
FIG. 3 depicts the laser source of FIG. 1 with a wavelength locker.

Referring now to FIG. 3, a wavelength locker 32 can be provided that monitors the wavelength of a channel, for example, the emission wavelength $\lambda_3$. Light can be coupled out through a fiber coupler 116 from the fiber ring 12 or by tapping into one of the wavelength-separated outputs 105a, 105b or 105c (not shown) or any other location where optical radiation can be tapped. Information derived from a single wavelength $\lambda_3$ can thereby control the entire set of wavelengths $\lambda_1$, $\lambda_2$, $\lambda_3$ through feedback control of the grating 102 and/or the etalon 122 and/or lateral translation of the reflectors along A.

In one embodiment of a wavelength locker, a beat frequency between one of the laser lines, e.g. $\lambda_3$, and a reference laser which is locked, for example, to an absorption cell, such as the molecular absorption line of acetylene, can be monitored. The wavelength locker may also be composed of a temperature stabilized etalon locked to an ITU grid channel. Since the reference laser can be locked to better than 1 part in $10^7$–$10^8$ and the beat frequency may be known to kHz, the system can in principle be stabilized to better than 0.01 GHz. This level of stabilization is exceptional for a communication laser. Wavelength stability of 1 picometer or 0.125 GHz should be adequate for channel spacing of less than 12.5 GHz. Other wavelength locking technologies, for example an athermalized etalon tuned to the ITU grid, may also be used. The output wavelengths $\lambda_1$, $\lambda_2$, $\lambda_3$ of the system 30 can be adjusted, for example, by rotating the grating and translating the output fiber array, and/or by changing the etalon spacing, as depicted in FIG. 3.

It should be noted that in place of an etalon, other interferometer structures, such as a Sagnac interferometer, may be used to define the fiber laser emission lines. Moreover, an output with overlapping wavelengths $\Sigma\lambda_i$ is also available at the output coupler 116 and can be used for general monitoring and testing purposes.

Figure 4:
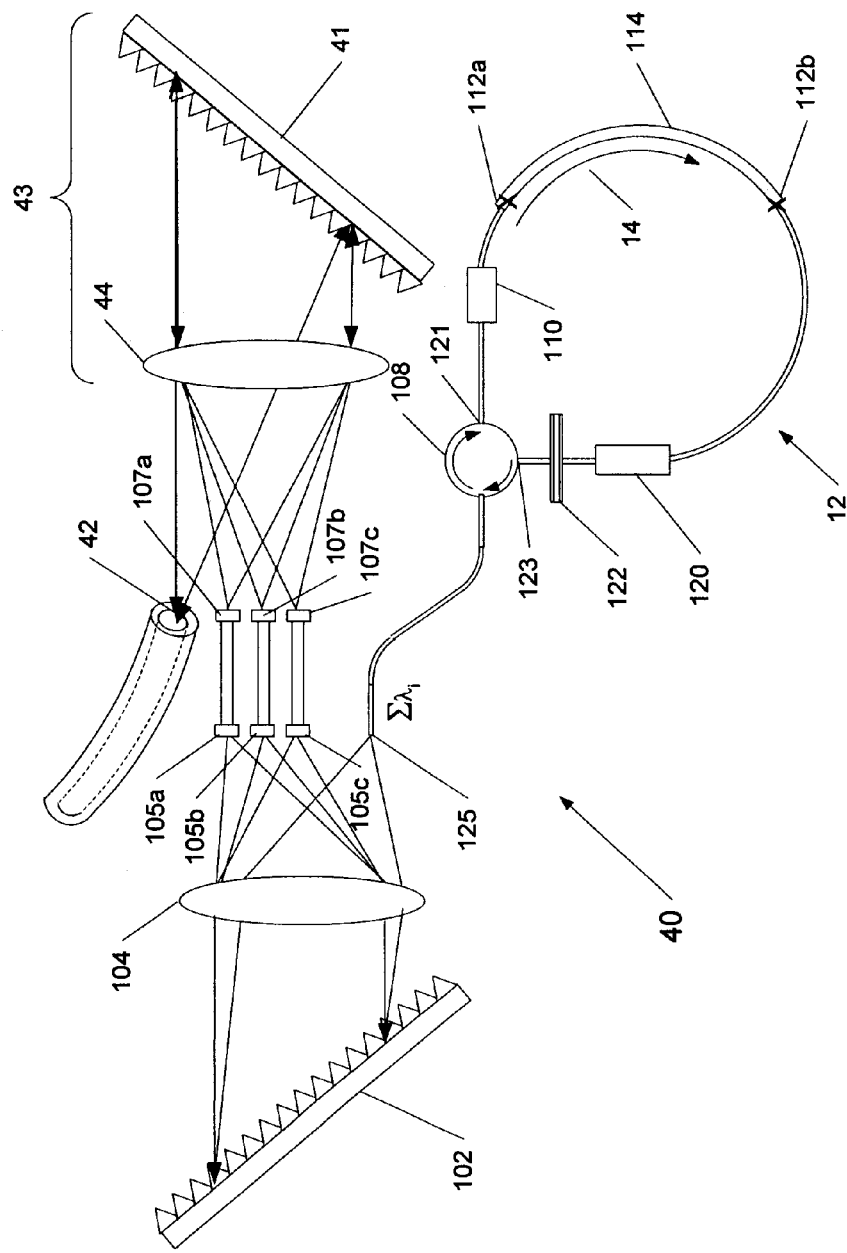
FIG. 4 depicts the laser source of FIG. 1 with a grating beam combiner.

As shown in FIG. 4, the modulated output from the external modulators 107a, 107b, 107c can be combined by a beam combiner 43 into an overlapping beam that includes the wavelengths $\lambda_1$, $\lambda_2$, $\lambda_3$. The exemplary beam combiner 43 includes a focusing element 44 and a grating 41. The output faces of modulators 107a, 107b, 107c are located in the focal plane of the focusing element 44, shown here as a lens. The grating 41 intercepts the preferably collimated radiation from lens 44 and forms the overlapping beam at, for example, an input facet of a fiber waveguide 42. The overlapping beam with the combined wavelengths $\Sigma\lambda_i$ is then propagated through the fiber waveguide. Instead of the fiber, other optical elements, such as free space optics and planar optical waveguides, can also receive the overlapping beam.

Other types of beam combiners can be used instead of the grating-based beam combiner 43. For example, the output beams emerging from modulators 107a, 107b, 107c can be imaged onto corresponding input facets of optical waveguides, a star coupler or an arrayed-waveguide grating (AWG), as described in commonly assigned U.S. patent application "Modulatable Multi-Wavelength Semiconductor External Cavity Laser" by John Hoose and Robert Frankel, filed on even date herewith. Star couplers and AWG's are known in the art. It will be understood that a star coupler combines the intensities of the various laser beams, whereas the grating coupler and the AWG provide additional wavelength selectivity.

With an electroabsorptive modulator, the entire output module after the output coupling mirrors can be fabricated on a planar substrate. Lens coupling the second multiplexer opens the possibility of placing the source module for an entire communication system in one small unit.

The multi-wavelength fiber laser system described herein may form the entire source module for a multi-channel communication system. As mentioned above, the cavity end mirrors 105a, 105b, 105c can be tailored to provide a flat gain over a predetermined wavelength range. In addition, the end mirrors may be dithered to reduce gain pulling.

While the invention has been disclosed in connection with the preferred embodiments shown and described in detail, various modifications and improvements thereon will become readily apparent to those skilled in the art. Although only three exemplary wavelengths $\lambda_1$, $\lambda_2$, $\lambda_3$ are shown, the fiber laser can emit a greater number of wavelengths suitable for the application. The dispersive elements can also be immersion gratings of a type described, for example, in commonly assigned U.S. patent application Ser. No. 09/950,124, having filing date of Sep. 10, 2001, the entire content of which is incorporated herein by reference. Immersion gratings are made of a transparent material with a suitable index of refraction (e.g. $n \geq 1$) which advantageously decreases the overall physical size of the system. For example, in the wavelength range of the ITU grid, silicon (n~3.5), is a suitable material for an immersion grating. Accordingly, the spirit and scope of the present invention is to be limited only by the following claims.

What is claimed is:

1. Multi-wavelength external cavity fiber laser, comprising:

a fiber-optic amplifier (FOA) optically coupled to an optical circulator (OC), the FOA receiving optical radiation from a first port of the OC and supplying amplified optical radiation to a second port of the OC, said optical radiation having a plurality of wavelengths, an optical element having a focal plane, the optical element positioned to place the focal plane at a third port of the OC and to intercept the amplified optical radiation emerging from the third port;

a partially reflecting output coupler;

a dispersive element positioned in an optical path between the optical element and the output coupler, said partially reflecting output coupler adapted to intercept the plurality of diffracted output beams produced by the dispersive element, each output beam having a unique wavelength, and a plurality of optical modulators arranged outside the external cavity, each modulator associated with and adapted to intercept and to modulate an intensity of a respective one of the diffracted optical output beams, wherein the partially reflecting output coupler and the FOA coupled to the OC form the external cavity that produces the plurality of wavelengths.

2. The laser source of claim 1, further comprising a reflecting element, wherein the dispersive element is positioned between the optical element and the reflecting element; and wherein the reflecting element is positioned to intercept radiation from the dispersive element and to retroreflect the intercepted radiation to the dispersive element.

3. The fiber laser of claim 1, wherein a reflectivity of the partially reflecting output coupler for each of the diffracted output beams is selected so as to flatten the optical gain of the FOA across the plurality of wavelengths.

4. The fiber laser of claim 1, further comprising an acousto-optic frequency shifter (AOFS) located between the FOA and the first port of the OC.

5. The fiber laser of claim 1, further comprising a spectral filter disposed in the external cavity.

6. The fiber laser of claim 5, wherein the spectral filter is a Fabry-Perot etalon.

7. The fiber laser of claim 1, and further comprising a spectral filter is disposed between the FOA and the second port of the OC and a wavelength locker which derives an input signal from a single wavelength of the plurality of wavelengths and controls the spectral filter so as to lock said single wavelength, thereby collectively locking each wavelength of the plurality of wavelengths based on the input signal from the single wavelength.

8. The fiber laser of claim 1, further including a beam combiner that intercepts the modulated transmitted radiation having the plurality of wavelengths and combines the intercepted radiation into an overlapping beam comprising the plurality of wavelengths.

9. The fiber laser of claim 8, wherein the beam combiner comprises:
- a second optical element having a second focal plane, the second optical element positioned to substantially place the second focal plane at the plurality of the optical modulators and to intercept the generated optical radiation transmitted by the optical modulators; and
- a second dispersive element adapted to intercept radiation from the second optical element and to return through the second optical element an overlapping beam comprising the modulated transmitted radiation having the plurality of wavelengths.

10. The fiber laser of claim 9, further comprising:
an optical receiving element that receives in the second focal plane the controllably modulated transmitted radiation.

11. The fiber laser of claim 10, wherein the optical receiving element comprises an optical fiber.

12. The fiber laser of claim 8, wherein the beam combiner comprises an N×1 optical coupler.

13. The fiber laser of claim 12, wherein the optical coupler is a fiber coupler.

14. The fiber laser of claim 12, wherein the optical coupler is an arrayed-waveguide grating (AWG) coupler.

15. The fiber laser of claim 12, wherein the optical coupler is a star coupler.

16. The fiber laser of claim 1, wherein the dispersive element is a free space grating.

17. The fiber laser of claim 1, wherein the dispersive element is an immersion grating.

18. The fiber laser of claim 11, wherein the immersion grating comprises silicon.

19. The fiber laser of claim 8, wherein the second dispersive element is a free space grating.

20. The fiber laser of claim 9, wherein the second dispersive element is an immersion grating.

21. The fiber laser of claim 20, wherein the immersion grating comprises silicon.

22. Method for producing externally modulated multi-wavelength laser radiation, comprising:
generating with a fiber-optic gain element amplified optical radiation with a plurality of wavelengths;
diffracting the amplified optical radiation to produce a plurality of spatially separated optical beams, each beam having a unique wavelength;
reflecting a portion of a light intensity of the plurality of optical beams;
recombining the reflected plurality of spatially separate optical beams into an overlapping beam that includes the plurality of wavelengths beams and returning the overlapping beam to the fiber-optic gain element; and
extracting a remaining portion of the light intensity of the spatially separated plurality of optical beams, and
externally modulating the extracted portion the remaining light intensity to produce spatially separated, externally modulated, multi-wavelength laser radiation.

* * * * *